United States Patent [19]

Barker

[11] Patent Number: 4,931,920

[45] Date of Patent: Jun. 5, 1990

[54] CIRCUIT AND METHOD FOR REGULATING OUTPUT VOLTAGE OF A SWITCH MODE POWER SUPPLY HAVING A CURRENT MODE MAGNETIC AMPLIFIER

[75] Inventor: Mark P. Barker, Deltona, Fla.

[73] Assignee: NCR Corporation, Dayton, Ohio

[21] Appl. No.: 367,283

[22] Filed: Jun. 16, 1989

[51] Int. Cl.$^5$ ............................................. H02M 3/28
[52] U.S. Cl. ...................................... 363/82; 363/21; 363/91
[58] Field of Search ................. 363/19, 21, 82, 91–93; 323/254

[56] References Cited

U.S. PATENT DOCUMENTS

| | | | |
|---|---|---|---|
| 2,830,250 | 4/1958 | Fredrick et al. | 363/91 |
| 4,447,866 | 5/1984 | Reeves | 363/21 |
| 4,451,876 | 5/1984 | Ogata | 363/21 |
| 4,459,651 | 7/1984 | Fenter | 363/21 |
| 4,462,069 | 7/1984 | Becky | 363/23 |
| 4,562,522 | 12/1985 | Adams et al. | 363/21 |
| 4,580,090 | 4/1986 | Bailey et al. | 323/303 |
| 4,642,743 | 2/1987 | Radcliffe | 363/21 |
| 4,679,131 | 7/1987 | Filliman | 363/21 |
| 4,710,859 | 12/1987 | Rilly | 363/21 |
| 4,761,702 | 8/1988 | Pinard | 361/18 |
| 4,799,138 | 1/1989 | Chahabadi et al. | 363/21 |

FOREIGN PATENT DOCUMENTS

| | | | |
|---|---|---|---|
| 114213 | 7/1983 | Japan | 363/21 |
| 72980 | 4/1984 | Japan | 363/21 |
| 189974 | 8/1987 | Japan . | |
| 242167 | 10/1988 | Japan . | |

Primary Examiner—William H. Beha, Jr.
Attorney, Agent, or Firm—Wilbert Hawk, Jr.; Stephen F. Jewett; James M. Stover

[57] ABSTRACT

A circuit for regulating the output voltage of a switched mode power supply having a current mode magnetic amplifier includes a current transformer for sensing current flow through the magnetic amplifier. The sensed current is provided to a circuit which includes a resistor for developing a pulsating voltage and a storage capacitor for converting the pulsating voltage to a tracking voltage and storing the tracking voltage. The tracking voltage and a reference voltage are provided to a differential amplifier, the output of which operates a transistor which controls the operation of the magnetic amplifier, thereby regulating the output voltage of the power supply.

15 Claims, 2 Drawing Sheets

CIRCUIT AND METHOD FOR REGULATING OUTPUT VOLTAGE OF A SWITCH MODE POWER SUPPLY HAVING A CURRENT MODE MAGNETIC AMPLIFIER

The present invention relates to power supplies. More particularly, it relates to a method and circuit for regulating the output voltage of switch mode power supplies.

BACKGROUND OF THE INVENTION

Most electronic and computer systems require DC voltage for their operation. A typical power supply for such systems converts AC line current to a regulated DC voltage. A "switch mode" type power supply first converts AC to an unregulated DC which is then controllably pulsed to a regulated DC output. For example, conversion of AC to an unregulated DC may be achieved by rectifying the AC and storing the non-regulated DC voltage in bulk capacitors. Current from the bulk capacitors is then periodically switched or pulsed across a primary winding of a transformer. The pulsating D.C. waveform is received by a secondary winding of the transformer, rectified, regulated, and stored in capacitors which provide the primary DC output voltage of the power supply.

"Regulation" of the D.C. output voltage refers to limiting changes or swings in the output voltage level. This is particularly important in many applications where small deviations from the design voltage level can affect the operation of the equipment being supported by such power supply. A voltage regulator which has been used successfully with switch mode power supplies is a magnetic amplifier (mag amp). A mag amp uses one or more saturable reactors either alone or in combination with other components to control power gain. A saturable reactor is a coil with a magnetic core whose reactance may be controlled by applying a voltage to control the blocking capability of the core. As the blocking capability of the core changes, the pulse width of voltage pulses passing therethrough will be changed. For example, if the output voltage were to increase, increasing the blocking capability of the saturable reactor decreases the pulse width of the voltage pulse passing therethrough, thereby decreasing the output voltage. Similarly, small decreases in the output voltage can be overcome by decreasing the blocking capability of the core. A conventional way to control the blocking capability of the core is to develop an error signal from changes in the output voltage and apply the error signal to the control electrode of a transistor. In response, the transistor controls the application of a reset voltage which changes the blocking capability of the core.

In addition to regulating the output voltage by monitoring the output voltage, it is also known to control the output voltage by monitoring both the output voltage and current. Such current mode regulation involves sensing the D.C. output current and developing a voltage proportional to the output current. One technique for sensing the output current involves passing the current through a resistor and detecting the voltage across the resistor. This has the disadvantage of dissipating power, a problem which increases as the current increases.

It is known to use a detection circuit with a current transformer for detection of the discontinuous unregulated input current The secondary winding of the current transformer is connected to a resistor or parallel resistor and capacitor. The voltage developed on the resistor is provided to a differential amplifier, the output of which terminates unregulated input pulses to the power supply when the developed voltage exceeds a predetermined value. Such detection circuits provide a current limit but do not closely regulate the output current.

OBJECTS OF THE INVENTION

It is therefore an object of the present invention to provide a new and improved circuit for power supply voltage regulation.

It is another object of the present invention to provide a new and improved method for power supply regulation.

It is a further object of the present invention to provide an improved current mode magnetic amplifier power supply.

It is yet another object of the present invention to provide a switch mode power supply which regulates output voltage as a function of a discontinuous power supply current.

It is yet a further object of the present invention to provide a switch mode power supply which regulates output voltage as a function of output voltage and output current.

It is still another object of the present invention to provide a unique capture and hold circuit for generating a tracking voltage proportional to a current.

It is still a further object of the present invention to provide a fast response capture and hold circuit for tracking a discontinuous current.

SUMMARY OF THE INVENTION

The present invention is a circuit and method for regulating the output voltage of a switch mode power supply having a magnetic amplifier for controlling the output voltage. The circuit comprises means for generating a tracking voltage from a discontinuous current flowing into said magnetic amplifier, and means for varying the operating point of the amplifier in response to the tracking voltage to control the output voltage.

DESCRIPTION OF A PREFERRED EMBODIMENT

Figure 1A:
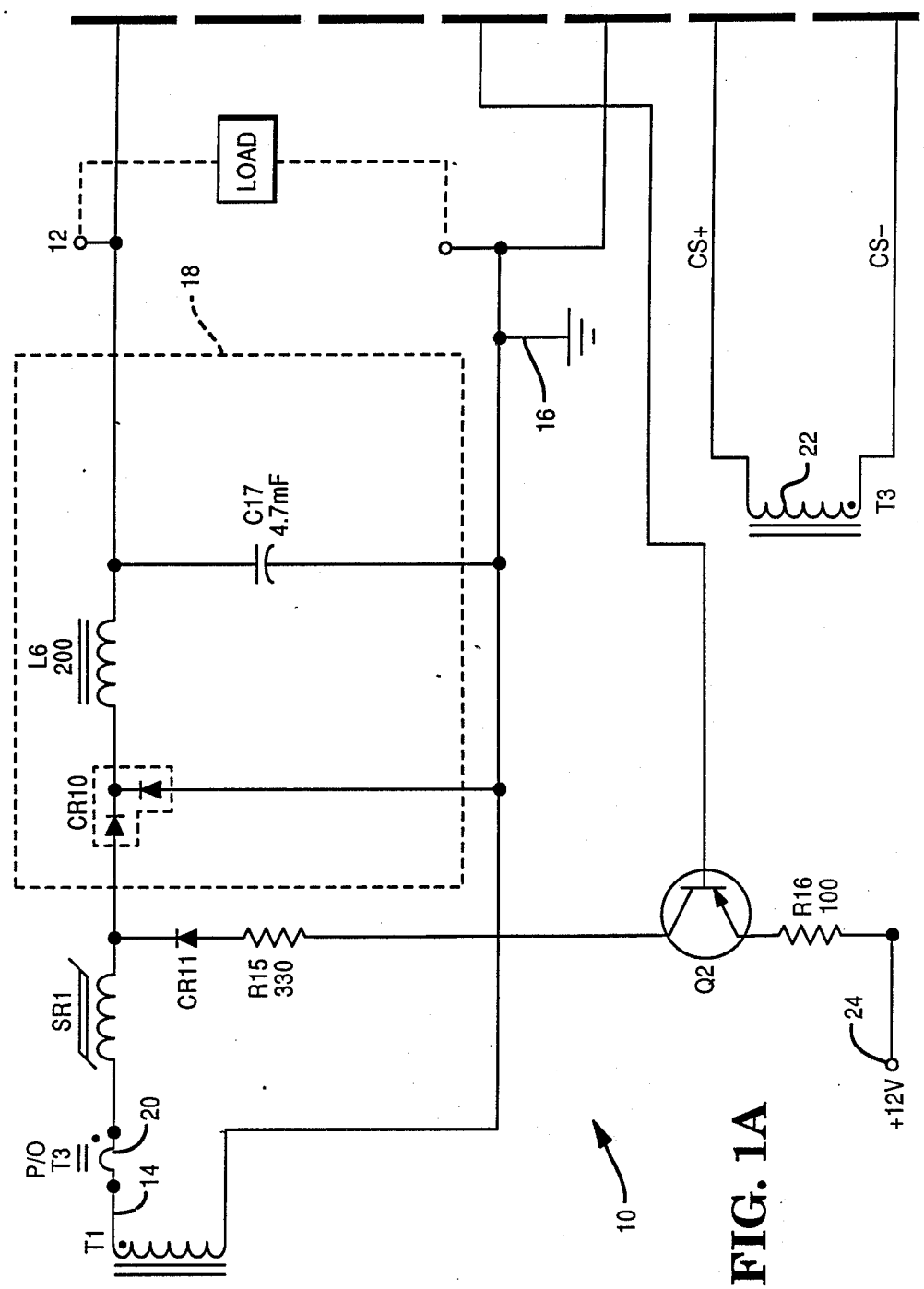
FIGS. 1A and 1B show a circuit diagram of a voltage regulator according to one form of the present invention.
Figure 1B:
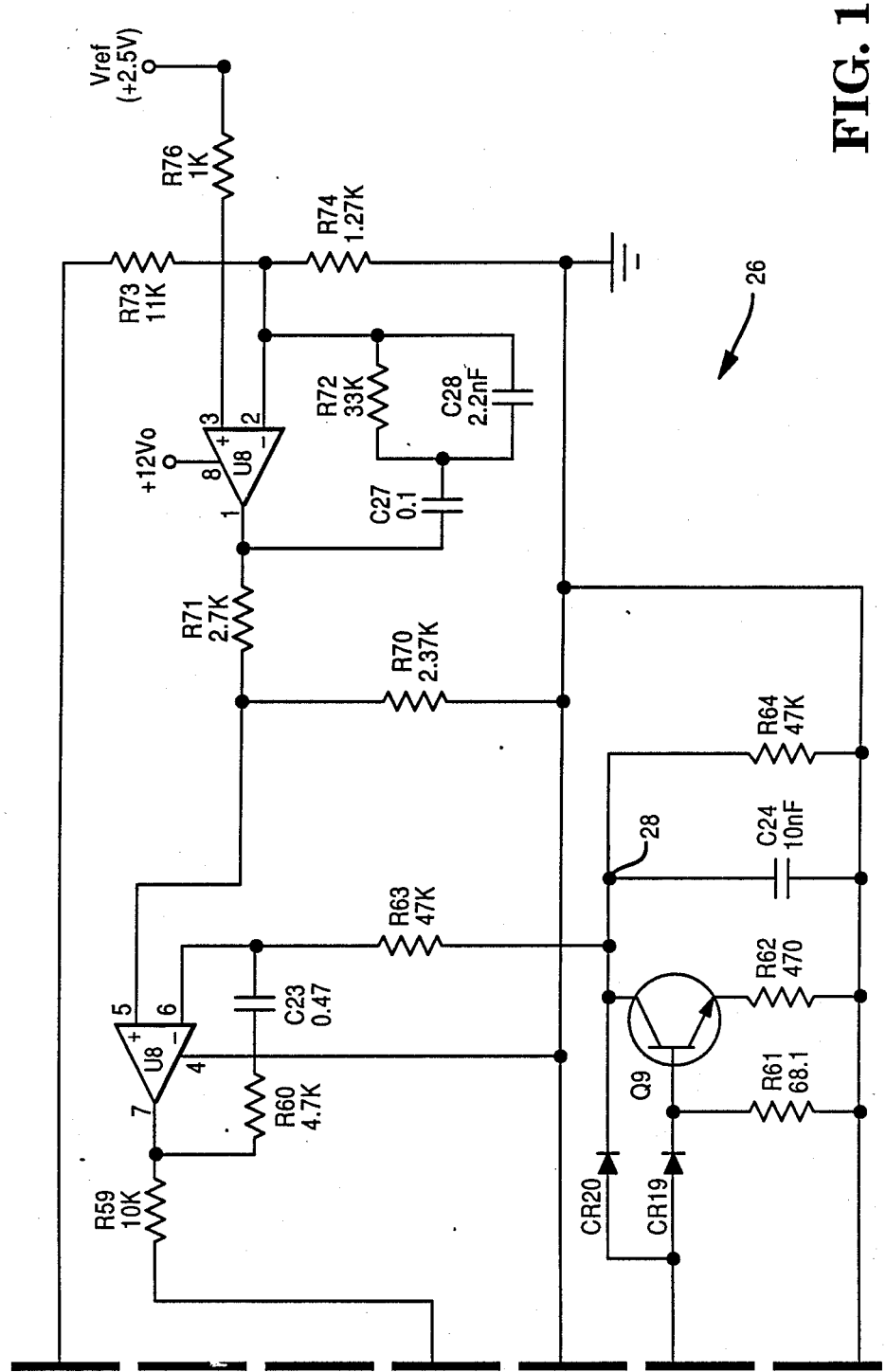

FIGS. 1A and 1B show a circuit 10 for supplying a regulated output voltage at a D.C. output voltage terminal 12. Referring to FIG. 1A, circuit 10 includes a secondary transformer winding T1 for receiving an input voltage pulse. Winding T1 is connected between an input voltage line 14 and a first reference potential terminal 16 which in a preferred embodiment is ground. Circuit 10 is part of a switch mode power supply. The portion of the power supply not shown in the drawings receives A.C. line current which is converted to a D.C. voltage and stored in bulk capacitors. A switching circuit periodically pulses the D.C. voltage across a primary transformer winding. The square wave so generated is received by secondary transformer winding T1. For an example of a switch mode power supply which provides D.C. pulses see copending U.S. patent application Ser. No. 319,601, hereby incorporated by reference.

Circuit 10 also comprises a current transformer T3, a magnetic amplifier which includes saturable reactor SR1, and an output filter 18. Current transformer T3 has a primary winding 20 and a secondary winding 22. Filter 18 includes a rectifier CR10, inductor L6 and capacitor C17. The primary winding 20 of current transformer T3 is series connected with saturable reactor SR1, rectifier CR10 and inductor L6 between input voltage line 14 and D.C. output voltage terminal 12. Circuit 10 further includes a reset transistor Q2, resistors R15 and R16, and diode CR11. Resistor R16, transistor Q2, Resistor R15 and diode CR11 are series connected between a second reference potential terminal 24 and the output side of saturable reactor SR1 (the common point between saturable reactor SR1 and rectifier CR10). In a preferred embodiment, reference potential terminal 12 is 24 volts and Q2 is a PNP bipolar transistor. In addition, transistor Q2 is a low to medium power transistor with a preferred value for a 24 volt output of 200 V, 0.5A (MJE350).

Circuit 10 further includes means for generating a tracking voltage from the discontinuous current flowing into saturable reactor SR1, i.e., proportional to the instantaneous peak current in primary winding 20 of current transformer T3. The term "discontinuous" refers specifically to the square wave power signal received on input line 14, and generally to any current waveform which dwells or passes through zero. Such means include resistor R61 connected across the secondary winding 22 of current transformer T3 for developing a secondary pulsating voltage. (The term "secondary" is used to distinguish between the pulsating voltage received on input line 14 and the pulsating voltage developed on resistor R61.) Resistor R61 sets up the voltage during the pulse, which voltage is stored on capacitor C24. Referring to FIG. 1B, the means for generating the tracking voltage also include capacitor C24, transistor Q9, resistors R61 and R62, and diodes CR19 and CR20. Diode CR20 and capacitor C24 are series connected in parallel with secondary winding 22 of current transformer T3. The anode of diode CR20 receives the secondary pulsating voltage developed on resistor R61 and the cathode of diode CR20 is connected to capacitor C24 at a storage node 28. Transistor Q9 and resistor R62 are series connected in parallel with capacitor C24. Diode CR19 and resistor R61 are series connected in parallel with secondary winding 22, with the anode of diode CR19 being connected to the anode of diode CR20. The control electrode of transistor Q9 is connected to the common point between diode CR19 and resistor R61.

Circuit 10 includes an error amplifier 26. Error amplifier 26 has a differential amplifier U8 with input terminal pins 5 and 6 and output terminal pin 7. In a preferred embodiment, differential amplifier U8 is an LM358. Input terminal pin 5 receives a reference voltage which varies in response to changes in the output voltage of circuit 10 at terminal 12. Input terminal pin 6 receives the tracking voltage and is connected through resistor R63 to storage node 28 (the common point between diode CR20 and capacitor C24). Output terminal pin 7 is connected through resistor R59 to the control electrode of reset transistor Q2.

In operation, a pulsating square wave input voltage and current is received on input voltage line 14 and is provided to saturable reactor SR1. Pulses passing through SR1 are smoothed by filter 18 to provide a D.C. output voltage and current to a load connected to output terminal 12. Changes in the output load will change the output current and can also create swings in the output voltage By varying the operating point of the magnetic amplifier SR1, the pulse width of the voltage pulse passing through SR1 may be adjusted to control the output voltage. For example, decreasing the pulse width will decrease the output voltage. According to one form of the present invention, the output voltage is controlled as a function of both the output voltage and current. However, an important feature of the subject invention is the control of output voltage as a function of output current, and, more particularly, as a function of the current flowing into the magnetic amplifier's saturable reactor SR1.

Current transformer T3 and resistor R61 generate a secondary pulsating voltage which is derived from and is proportional to the pulsating input current flowing in input line 14 and the primary winding 20 of transformer T3. Since the current in the primary winding 20 of transformer T3 is proportional to the output current of circuit 10, the secondary pulsating voltage is proportional to the output current of the power supply. This relationship occurs because during the input pulse, the current flowing through input line 14 is the same as the inductor L6 current. Since the current in inductor L6 is roughly equal to the output current, the input current during the pulse is roughly equal to the output current.

Each pulse of the secondary pulsating voltage on resistor R61 is captured and stored by capacitor C24, capacitor C24 being charged through diode CR20. Thus, capacitor C24 converts the secondary pulsating voltage to a tracking voltage and stores the tracking voltage at storage node 28. The tracking voltage is proportional to the discontinuous current flowing into saturable reactor SR1. An important feature of the subject invention is that the charge on capacitor C24 will track the discontinuous current flowing into saturable reactor SR1. For, example, if the output current should increase, the current through primary winding 20 of transformer T3 will increase which will increase the peak charge of the pulses on resistor R61. Since the peak pulse voltage on resistor R61 exceeds the previously stored voltage at storage node 28, diode CR20 will conduct and the charge on capacitor C24 will increase to the higher value. On the other hand, if the output current should decrease, the voltage of the pulses on resistor R61 will decrease. Since the peak pulse voltage on resistor R61 is less that the stored voltage at node 28, diode CR20 will not conduct. However, diode CR19 will conduct providing a base current to turn transistor Q9 on. Capacitor C24 will then discharge through transistor Q9 and resistor R62 allowing the voltage at node 28 to decrease towards the voltage on resistor R61. In this manner, the tracking voltage on node 28 will track the discontinuous current flowing into saturable reactor SR1. It will be noted that in the exemplary embodiment shown in the drawings, resistor R62 has a resistance of 470 ohms. This relatively low resistance allows capacitor C24 to discharge rapidly when the output current decreases, allowing its charge to closely track instantaneous decreases in the peak output current. It should also be noted that capacitor C24 has a capacitance of only 10 nF. This relatively small capacitance allows rapid charging of capacitor C24 when the output current increases so that it closely tracks instantaneous increases in the peak current in saturable reactor SR1. In a preferred embodiment transistor Q9 is a relatively low power transistor, with low storage time and fast switching, such as a 2N3904 transistor.

The tracking voltage is provided to input pin 6 of differential amplifier U8. Input pin 5 of differential amplifier U8 receives a reference voltage, which in the embodiment shown is itself an error voltage derived from the output voltage of circuit 10. However, the subject invention applies equally to a circuit providing a predetermined fixed reference voltage to input pin 5 of differential amplifier U8. The output pin 7 is an error signal which reflects changes in the output current of circuit 10. The output of differential amplifier U8 (pin 7) is provided to the control electrode of reset transistor Q2. By varying the base voltage of transistor Q2, the operating point of saturable reactor SR1 will vary. In other words, as the conductivity of transistor Q2 changes, the voltage applied to SR1 through diode CR11 will change which will change the blocking capability of the core of SR1. As the core blocking capability increases, the pulse width of voltage pulses passing through SR1 will decrease. Similarly, decreasing core blocking capability will increase the pulse width. In this manner, the output voltage of circuit 10 is controlled in response to the tracking voltage.

As noted above, the reference voltage applied to input pin 5 of differential amplifier U8 is an error voltage derived from the output voltage of circuit 10. More specifically, the output voltage of circuit 10 is monitored and divided by resistors R73 and R74 and applied to input pin 2 of differential amplifier U8. Input pin 3 of differential amplifier U8 receives a predetermined reference voltage, which in a preferred embodiment is about 2.5 volts. The error signal provided by output pin 1 of differential amplifier U8 varies in response to changes in the output voltage of circuit 10. Changes in the output voltage of circuit 10 will show up as changes to this error signal. The error signal is provided to the input pin 5 of differential amplifier U8. Thus, in the illustrated embodiment, the output signal from pin 7 reflects changes to both the tracking voltage and output voltage of circuit 10. Thus, the input voltage pulse width is controlled by saturable reactor SR1 as a function of both the output voltage and current of circuit 10.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is claimed and desired to be secured by Letters Patent of the United States is as follows.

1. A circuit for generating a tracking voltage proportional to a current comprising:
   a current transformer having a primary and secondary winding with said primary winding receiving said current and said secondary winding having a first resistor connected in parallel therewith to develop a pulsating voltage;
   a capacitor connected between a storage terminal and first reference potential terminal for converting said pulsating voltage to said tracking voltage and storing said tracking voltage;
   a series connected transistor and second resistor connected in parallel with said capacitor;
   a first diode with its anode connected to said secondary winding and its cathode connected to said storage terminal; and
   a second diode connected between the anode of said first diode and the control electrode of said transistor, wherein said first resistor is connected between said control electrode and said first reference potential terminal.

2. A circuit for regulating the output voltage of a switch mode power supply having a magnetic amplifier for controlling said output voltage comprising:
   means for generating a tracking voltage from a discontinuous current flowing into said magnetic amplifier, said generating means including:
      a current transformer having a primary and secondary winding with said primary winding connected to said magnetic amplifier and said secondary winding having a first resistor connected in parallel therewith to develop a secondary pulsating voltage;
      a capacitor connected between a storage terminal and first reference potential terminal for converting said secondary pulsating voltage to said tracking voltage and storing said tracking voltage; and
      a series connected transistor and second resistor connected in parallel with said capacitor; and
   means for varying the operating point of said amplifier in response to said tracking voltage to control said output voltage.

3. The circuit of claim 2 wherein said generating means further includes a first diode with its anode connected to said secondary winding and its cathode connected to said storage terminal.

4. The circuit of claim 3 wherein said generating means further includes a second diode connected between the anode of said first diode and the control electrode of said transistor, and wherein said first resistor is connected between said control electrode and said first reference potential terminal.

5. A circuit for regulating the output voltage of a switch mode power supply having a magnetic amplifier for controlling said output voltage, said magnetic amplifier including a saturable reactor, said circuit comprising:
   means for generating a tracking voltage from a discontinuous current flowing into said magnetic amplifier; and
   means for varying the operating point of said amplifier in response to said tracking voltage to control said output voltage, said varying means including:
      a reset transistor connected between said reactor and a second reference potential terminal; and
      a differential amplifier with a first input terminal for receiving said tracking voltage, a second input terminal for receiving a reference voltage which varies in response to changes in said output voltage, and an output terminal connected to the control electrode of said reset transistor.

6. A circuit for regulating the output voltage of a switch mode power supply having a magnetic amplifier for controlling said output voltage comprising:
   means for generating a tracking voltage from a discontinuous current flowing into said magnetic amplifier, said generating means including:
      a current transformer having a primary and secondary winding with said primary winding connected to said magnetic amplifier and said secondary winding having a first resistor connected in parallel therewith to develop a secondary pulsating voltage;

a capacitor connected between a storage terminal and first reference potential terminal for converting said secondary pulsating voltage to said tracking voltage and storing said tracking voltage;

a series connected transistor and second resistor connected in parallel with said capacitor;

a first diode with its anode connected to said secondary winding and its cathode connected to said storage terminal; and a second diode connected between the anode of said first diode and the control electrode of said transistor, wherein said first resistor is connected between said control electrode and said first reference potential terminal; and means for varying the operating point of said amplifier in response to said tracking voltage to control said output voltage, wherein said magnetic amplifier includes a saturable reactor, said varying means including:

a reset transistor connected between said reactor and a second reference potential terminal; and a differential amplifier with a first input terminal for receiving said tracking voltage, a second input terminal for receiving a reference voltage, and an output terminal connected to the control electrode of said reset transistor.

7. The circuit of claim 6 wherein said reference voltage varies in response to changes in said output voltage.

8. A circuit for supplying a regulated output voltage in a switch mode power supply comprising:

a secondary transformer winding for receiving an input voltage pulse, said winding connected between an input voltage line and a first reference potential terminal;

a DC output voltage terminal;

a current transformer having a primary and secondary winding;

a saturable reactor;

an output filter having an inductor series connected with said saturable reactor and current transformer primary winding between said output voltage terminal and input voltage line;

a reset transistor connected between a second reference potential terminal and the output side of said saturable reactor;

means for generating a tracking voltage from the current in said current transformer primary winding;

an error amplifier including a differential amplifier with a first input terminal for receiving said tracking voltage, a second input terminal for receiving a reference voltage which varies in response to changes in said output voltage, and an output terminal connected to the control electrode of said reset transistor.

9. The circuit of claim 8 wherein said means includes a first resistor connected across the secondary winding of said current transformer to provide a secondary pulsating voltage.

10. The circuit of claim 9 wherein said means further includes a series connected first diode and capacitor connected in parallel with said current transformer secondary winding to provide said tracking voltage.

11. The circuit of claim 10 wherein said means further includes a series connected second transistor and second resistor connected in parallel with said capacitor.

12. The circuit of claim 11 wherein said means further includes a second diode connected between said current transformer secondary winding and said first resistor, wherein the control electrode of said second transistor is connected to the common point between said second diode and first resistor.

13. The circuit of claim 12 wherein the first input terminal of said differential amplifier is connected to the common point between said first diode and capacitor.

14. A method for regulating the output voltage of a switch mode power supply having a magnetic amplifier for controlling said output voltage, the steps comprising:

providing a pulsating D.C. input voltage and current;

filtering said voltage and current to provide a D.C. output voltage and current;

generating a tracking voltage from a discontinuous current flowing into said magnetic amplifier, said generating step including the steps of:

deriving a secondary pulsating voltage from said pulsating input current; and converting said secondary pulsating voltage to said tracking voltage, said converting step including the steps of:

capturing and storing the peak charge on a pulse of said secondary pulsating voltage;

increasing the stored charge to the peak charge on each subsequent pulse having an increased charge; and reducing the stored charge to the peak charge on each subsequent pulse having a decreased charge; and controlling the pulse width of said input voltage in response to said tracking voltage.

15. The method of claim 14 wherein said controlling step includes:

providing a saturable reactor for receiving said pulsating D.C. input voltage and current;

connecting a reference potential terminal to said saturable reactor through a reset transistor;

converting said output voltage to a reference output voltage;

providing said tracking voltage and reference output voltage to a differential amplifier; and providing the output of said differential amplifier to the control electrode of said reset transistor.

* * * * *